United States Patent [19]
Sooriakumar et al.

[11] Patent Number: 5,578,167
[45] Date of Patent: Nov. 26, 1996

[54] SUBSTRATE HOLDER AND METHOD OF USE

[75] Inventors: Kathirgamasundaram Sooriakumar, Scottsdale; Steven A. Switzer, Tempe; Kenneth E. Stegall, Gilbert; Thomas J. Dunlap, Scottsdale; Colleen M. Albrecht, Phoenix, all of Ariz.

[73] Assignee: Motorola, Inc., Schaumburg, Ill.

[21] Appl. No.: 594,537

[22] Filed: Jan. 31, 1996

[51] Int. Cl.⁶ ...................................................... B23Q 3/00
[52] U.S. Cl. ........................ 156/654.1; 156/345; 267/287; 267/903; 118/503
[58] Field of Search .................................. 156/345, 654.1; 118/503; 269/287, 903

[56] References Cited
PUBLICATIONS

J. Kung et al., "A Compact, Inexpensive Apparatus for One–sided Etching in KOH and HF", Sensors and Actuators A, 29 (1991), pp. 209–215.

Primary Examiner—Richard Bueker
Attorney, Agent, or Firm—Bruce T. Neel

[57] ABSTRACT

The etching of a thin substrate (23) is performed using a holder (10). The holder (10) has a base (11) that has a cavity (20). The cavity (20) is pressurized to compensate for the pressure and stress that is applied to the substrate (23) by an etchant solution. The holder (10) also has a sequence of o-rings (22,24,26) that are used to hold the substrate (23) in place and to prevent etchant from leaking into the cavity (20) and attacking a bottom surface (32) of the substrate (23). The pressure necessary to hold the substrate (23) in place is applied by a cover ring (28) that is screwed onto the base (11).

19 Claims, 2 Drawing Sheets

SUBSTRATE HOLDER AND METHOD OF USE

BACKGROUND OF THE INVENTION

This invention relates, in general, to semiconductor devices, and more particularly, to handling equipment used in the manufacture of semiconductor devices.

A sensor device is one form of semiconductor device that generally uses a thin diaphragm over a cavity to measure a pressure. The thin diaphragm is commonly a layer of crystalline silicon that is on the order of 50 microns thick and is thin enough to flex in response to slight changes in pressure. The change in pressure can be determined by quantifying the amount of flex in the thin diaphragm over the cavity. To fabricate a typical sensor device, two layers of semiconductor material are bonded together and one of the layers is thinned to the desired thickness to provide the diaphragm. A specially designed selective etch is then used to remove a portion of the second layer of semiconductor material to form a cavity below the thinned first layer.

One of the difficulties associated with manufacturing a sensor device is the handling of such delicate layers while forming the cavity. Again, the diaphragm is only 50 microns thick and is easily destroyed by stress applied to the sensor device. Another complication of the manufacturing process, is that great care must also be taken to ensure that only the proper portions of the semiconductor layers are exposed to the etchant that is used to form the cavity. Commonly used etchants will attack most exposed surfaces of semiconductor material, so the top of the diaphragm layer must be protected as the cavity is formed.

In large scale manufacturing operations, the throughput of each processing step involved with the formation of a sensor structure must be as efficient as possible. Most of the processing equipment used to handle semiconductor substrates during the formation of sensor devices is cumbersome and requires a considerable amount of time and effort to use the equipment. This handling time significantly affects the throughput of the manufacturing operations.

By now it should be appreciated that it would be advantageous to provide an apparatus for handling semiconductor substrates that meets the physical requirements of handling delicate layers during the formation of sensor structures. It would also be advantageous if the apparatus could ensure that only the desired portions of the semiconductor substrates are exposed to chemical etchants during processing. It would be of a further advantage if the apparatus reduced the total processing time of the manufacturing operation.

DETAILED DESCRIPTION OF THE INVENTION

The present invention provides a holder that can be used in a manufacturing flow to hold a semiconductor substrate. The holder is configured so that it is suitable for handling a semiconductor substrate while the substrate is placed into a chemical bath, such as during the formation of cavities in the fabrication of sensor devices. For such a process, the holder must be able to protect one side of the substrate from harsh etchants and be able to hold the delicate substrate so that it is not damaged during processing. The holder of the present invention has many features which make it applicable not only for the formation of sensor devices, but the holder has advantages that make it suitable for other processing steps as well.

As will be described in more detail below, the holder of the present invention comprises a sequence of o-rings or seals that provide many advantages over previously known holders. For example, the o-rings are configured such that the force used to keep the semiconductor substrate in place is evenly distributed around the semiconductor substrate. This is necessary to ensure that delicate substrates are not damaged during handling or processing. An additional feature of the o-ring configuration is that it protects one side of the substrate from etchant while the other side is being etched.

During processing, the semiconductor substrate, along with the holder, is typically immersed into a chemical bath. The fluid in the chemical bath will apply pressure to the semiconductor substrate, which is proportional to the depth of the semiconductor substrate in the chemical bath. Another advantage of the holder of the present invention is that the holder has an opening that is used to pressurize a cavity in the holder. The pressure of the cavity is applied against the bottom surface of the semiconductor substrate to equalize the pressure on both sides of the semiconductor substrate during processing. This allows for thinner substrates to be used with the holder because the risk of breaking the substrate due to a pressure differential is addressed. The pressurized cavity also serves as a leak test to determine if the o-rings are properly sealing the holder to prevent etchant from attacking the wrong side of the substrate.

An even further advantage of the holder of the present invention is that it provides an efficient method to load and unload the semiconductor substrate from the holder. This is a significant advantage in large scale manufacturing operations since it reduces the amount of time it takes to prepare a substrate for processing and unloading the substrate once the processing is complete.

Figure 1:
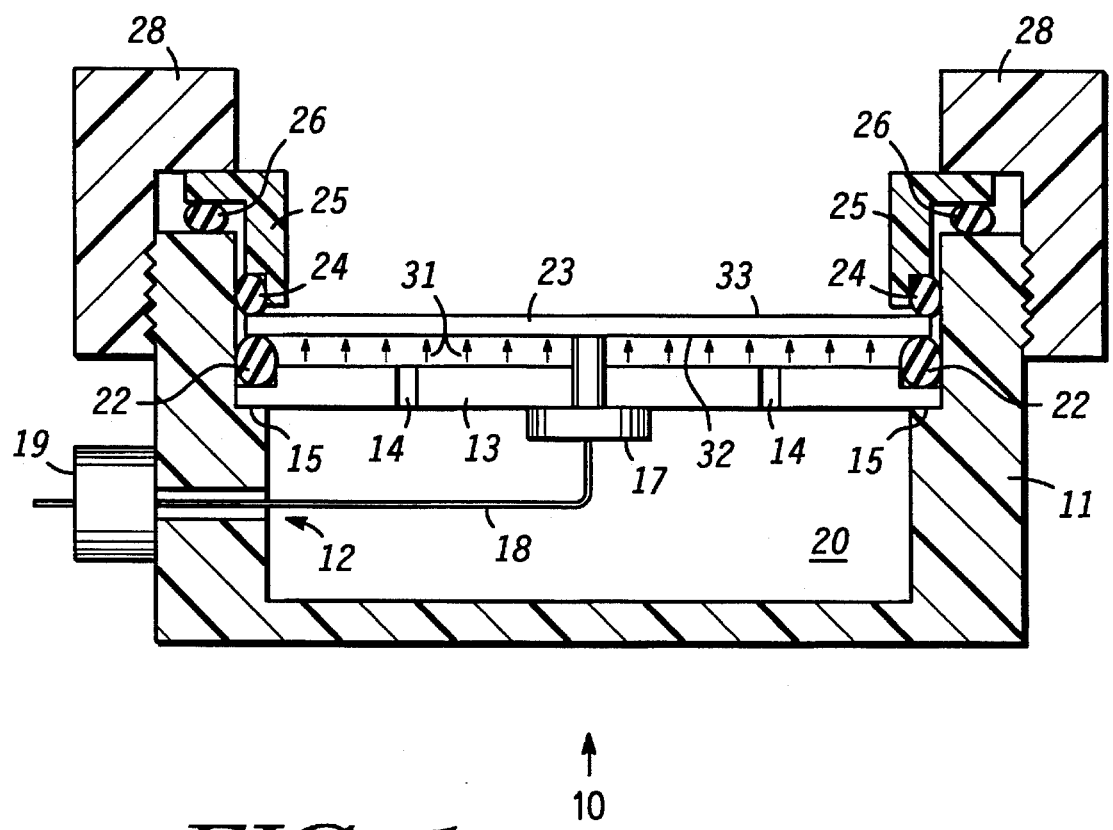
FIG. 1 is a sectional view of a holder according to the present invention.

Referring now to the figures, a more detailed description of the present invention will be provided. FIG. 1 is a sectional view of a holder 10 to be used in the processing of a semiconductor substrate or substrate 23. An exploded isometric view of holder 10 is provided in FIG. 2 which can be used to further understand how the portions of holder 10 connect together. First a structural description of holder 10 will be discussed to identify the components of holder 10. Following thereafter, a description of an example of how to use holder 10 will be provided.

Again referring primarily to FIG. 1, holder 10 comprises a base 11 that has a cavity 20 and an opening 12 through base 11. Opening 12 is used to provide an ambient to pressurize cavity 20 as will be described shortly. Base 11 also has a recessed area 15 which is used to provide physical support to a base plate 13. Base plate 13 is used to provide support for an electrical contact 17 and it should be understood that base plate 13 can also be formed as part of base 11 rather than as a separate component of holder 10. Electrical contact 17 is preferably a spring loaded electrical contact, but can be any mechanism for providing electrical connection to the bottom surface 32 of semiconductor substrate 23. In some processing operations, substrate 23 can be biased to accelerate or control the chemical reactions that are taking place. Therefore, electrical contact 17 can be used to provide a voltage potential to a bottom surface 32 of substrate 23 or be used to measure a voltage potential present at the bottom surface 32. It should be understood that the use of electrical contact 17 is optional if a processing step is not an electrochemical process, or otherwise has no need to bias substrate 23.

Base plate 13 also comprises holes or openings 14 that allow an ambient in cavity 20 to pass through base plate 13. This allows cavity 20 to be pressurized to apply pressure to bottom surface 32 of substrate 23. The pressure in cavity 20 can then be used to compensate for the pressure applied to substrate 23 during processing. Base plate 13 further includes a notch around its outer edge which is used to contain first o-ring 22. Other mechanisms can be used in base plate 13 to hold first o-ring 22 such as a groove or the like. First o-ring 22 is used to not only support substrate 23, but to provide some separation between base plate 13 and substrate 23. With substrate 23 resting on first o-ring 22, a second o-ring 24 is placed along the outer edge of a top surface 33 of substrate 23. Second o-ring 24 is used in conjunction with first o-ring 22 to keep substrate 23 in place and to prevent a fluid from seeping from the top surface 33 and reaching the bottom surface 32 when holder 10 is placed into a chemical bath (not shown).

Substrate 23 is firmly held in place during processing by a top ring 25, a third o-ring 26, and cover ring 28. Third o-ring 26 is used to prevent chemicals that might leak through top ring 25 and cover ring 28 from reaching bottom surface 32. Top ring 25 is placed in contact with both second o-ring 22 and third o-ring 26. Preferably, cover ring 28 screws onto base 11, which in turn, applies pressure to top ring 25 and second o-ring 24. It is this pressure that keeps substrate 23 in place and prevents etchant from attacking bottom surface 32 of substrate 23. It should also be understood that in other embodiments cover ring 28 can apply pressure to top ring 25 by other means such as by snapping onto base 11 or the like.

A method for using holder 10 will now be provided by way of an example where substrate 23 is dipped into an etch solution of potassium hydroxide (KOH). In this example, KOH is used to etch cavities (not shown) into top surface 33 of substrate 23 as might be done to form sensor devices. When forming sensor structures, at least a portion of substrate 23 is extremely thin and therefore substrate 23 must be handled with great care. In addition, the KOH solution must not leak into holder 10 such that KOH can attack the bottom surface 32 of substrate 23. To control the etching of substrate 23, an electrical bias is placed on substrate 23 using electrical contact 17 so that it is at a different voltage potential than the KOH etch solution. The electrical bias is used to monitor the progress of the KOH solution as the cavities are formed.

Figure 2:
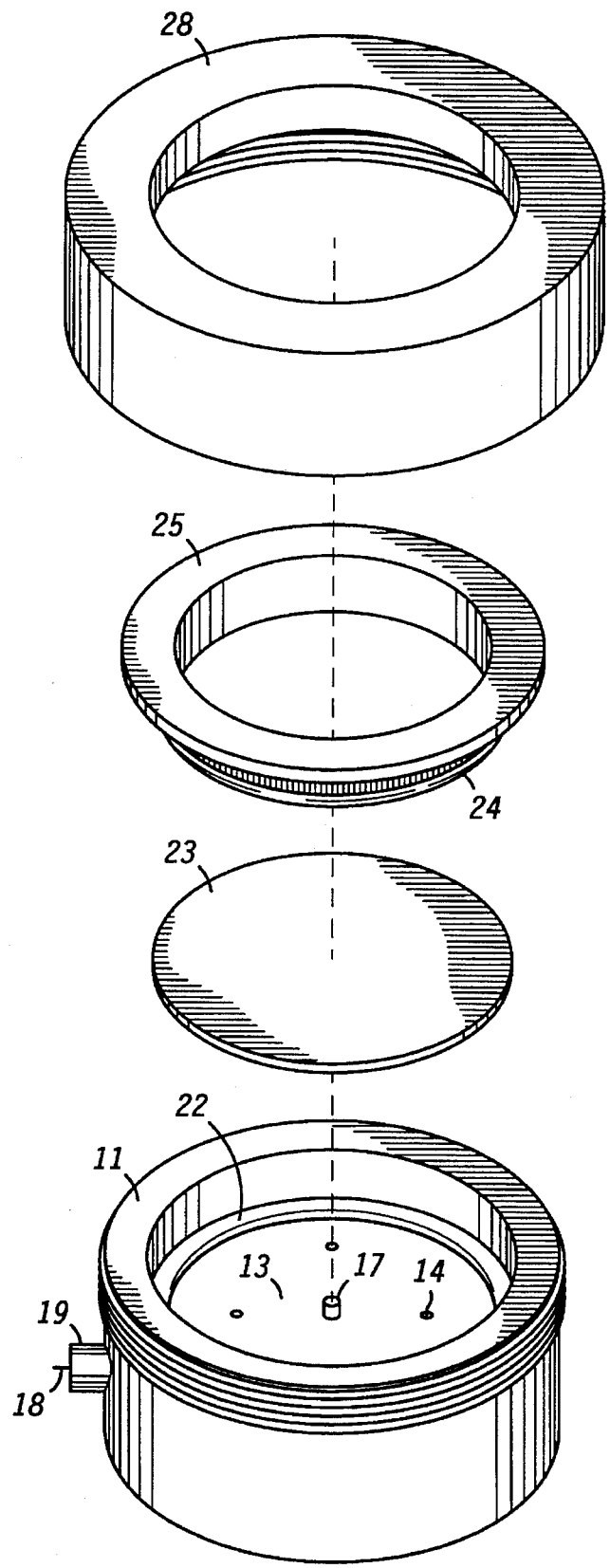
FIG. 2 is an isometric view of the holder of FIG. 1.

Before placing holder 10 into the solution of KOH, substrate 23 is placed into holder 10 has shown in FIGS. 1 and 2. Then contact is made to electrical contact 17 with a wire 18 that passes through opening 19. Base plate 13 is then placed into base 11 and first o-ring 22 is placed on base plate 13. Substrate 23 is then placed onto first o-ring 22 using conventional delicate handling equipment (not shown) and second o-ring 24 is place onto substrate 23 so that it conforms to the shape provided by base 11. When in place, substrate 23 will make contact with electrical contact 17 so a bias can be placed on substrate 23 during etching.

One advantage to the configuration of holder 10 is that first o-ring 22 and second o-ring 24 will apply pressure to substrate 23 evenly as cover ring 28 is screwed onto base 11. When placed onto substrate 23, second o-ring 24 conforms to the configuration of base 11 so as to minimize the distance second o-ring overlaps substrate 23, typically this distance is only 1 mm to 2 mm so as to minimize the amount surface area that is not exposed to the KOH etchant. It should also be understood the that shape of base 11 and base plate 13 can be altered to conform to the shape of substrate 23 so as to accommodate the use of minor or major flats (not shown) on substrate 23, yet still form an etchant-tight seal.

Third o-ring 26 is then place onto base 11 and is held in place by top ring 25. Cover ring 28 is then placed over top ring 25 and tightened by screwing cover ring 28 onto base 11 using a groove pattern. Preferably, cover ring 28 is hand tightened to simplify the processing step for an operator performing the KOH etch operation. As cover ring 28 is tightened, pressure is applied to top ring 25, which in turn applies pressure to first o-ring 22 and second o-ring 24. Because the leverage on substrate 23 is minimized by the sequence of o-rings 22, 24, and 26, it is nearly impossible to damage substrate 23 by over-tightening cover ring 28. This is due in part because first and second o-rings 22 and 24 distribute the pressure to substrate 23 evenly.

Now that substrate 23 is in place in holder 10, a leak check is performed to test if o-rings 22, 24, and 26 will prevent etchant from attacking the bottom surface 32 of substrate 23. To perform a leak test, a coupling 19 of base 11 is connected to an external ambient source (not shown) such as nitrogen. A leak check is then performed by placing holder 10 into a inert water solution and pressurizing cavity 20 with gas entering through opening 12. If bubbles are present along the edge of second o-ring 24, then o-rings 22,24, and 26 of holder 10 are rechecked and holder 10 is tightened. This operation is repeated until no bubbles are detected. This is of course an optional step, but the leak test helps insure that when holder 10 is placed into a KOH solution that there are no leaks that would allow etchant to attack the bottom surface 32 of substrate 23.

Once the leak test is completed, holder 10 is placed into a KOH solution and a bias is applied to substrate 23 relative to the KOH solution. Cavity 20 is then pressurized to the proper pressure using the ambient through opening 12. The proper pressure is determined by calculating the pressure that will be applied to substrate 23 from the top surface 33 from the KOH solution. This pressure will depend on the depth of holder 10 in the KOH solution. As the depth of holder 10 in the KOH solution is increased, the pressure applied to substrate 23 by the KOH solution will also increase. A corresponding pressure is then placed in cavity 20, which in turn applies pressure to the bottom surface 32 of substrate 23 (shown as arrows 31) to compensate for the pressure applied by the KOH solution. It should also be understood that in most applications the net pressure across substrate 23 is preferably zero, however, some applications may prefer a positive or negative net pressure differential.

In addition to reducing the amount of stress applied to the thin portions of substrate 23, the pressure in cavity 20 will also retard etchant from attacking the bottom surface 32 of substrate 23 should a leak develop in holder 10 during the etch process. Because the potentially damaging pressure applied by the KOH solution is offset, the present invention can be used to process wafers that are thinner than those that can be used in previously known apparatuses. For example, holder 10 can be used to process wafers that have portions that are only 1 micron to 10 microns thick.

The materials used to form the various elements of holder 10 will depend on the process conditions holder 10 will be exposed to. For example, if holder 10 is used in an electrochemical KOH etch process, then o-rings 22, 24, and 26 can be "Buna" o-rings or "Kalrez" o-rings and base 11, base plate 13, top ring 25 and cover ring 28 can be made from "Teflon" material. "Buna" is a registered trademark of Bayer-Aktiengesellschaft of Bayerwerk, Germany. "Teflon" and "Kalrez" are polymer compounds used regularly in the semiconductor industry and are registered trademarks of E. I. Du Pont De Nemours and Company of Wilmington, Del. It should also be understood that holder 10 can be used in a variety of processing applications including, but not limited to, the etching of silicon, nitride, polysilicon, and photoresist and holder 10 can be made from the corresponding materials that are necessary for that particular process.

A significant advantage of holder 10 of the present invention is that it is well suited for use in a high volume manufacturing operation. Because cover ring 28 is simply hand tightened onto base 11, it is readily and consistently used by operators performing the etching operation. Compared to some previously known holders used to process semiconductor wafers, holder 10 of the present invention has a much more efficient and simplified manner in which substrate 23 is placed in and taken out of holder 10. This improves the throughput of the etch operation and reduces the overall manufacturing cost of semiconductor devices that require this type of etch processing.

By now it should be appreciated that the present invention provides a holder and a method for its use. The holder is designed so that it can be used to handle delicate substrates by compensating for the pressure applied by the etch solution. The holder also provides for a leak check mechanism that allows the integrity of the holder to be verified to prevent the wrong portions of the substrate from being exposed to a chemical bath. The design of the holder of the present invention is optimal for high volume manufacturing operations where throughput is a key contributor to final manufacturing cost.

We claim:

1. A holder for a semiconductor substrate comprising:
   a base having a cavity;
   a base plate overlying the cavity and supported by the base, the base plate having an edge;
   a first o-ring mounted around the edge of the base plate;
   a top ring overlying the first o-ring and mated to the base by a second o-ring, the second o-ring being between the top ring and the base;
   a third o-ring overlying the first o-ring and contacting the top ring; and
   a cover ring mated to the base so that the cover ring applies a pressure to the top ring.

2. The holder of claim 1 further comprising an electrical contact supported by the base plate.

3. The holder of claim 1 further comprising a semiconductor substrate supported by the first o-ring and the second o-ring, wherein the semiconductor substrate has a bottom surface and a top surface and the third o-ring prevents a fluid from passing from the top surface to the bottom surface of the semiconductor substrate.

4. The holder of claim 3 wherein the base plate has at least one opening to allow an ambient from the cavity to pass through the base plate to apply a pressure to the semiconductor substrate.

5. The holder of claim 1 wherein the cover ring is attached to the base by screwing the cover ring onto the base using a groove pattern.

6. The holder of claim 1 wherein the base has an opening that allows an ambient to pass into the cavity.

7. The holder of claim 1 wherein the base, the base plate, and the cover ring are made from a polymer compound.

8. A holder for processing a semiconductor substrate, the holder comprising:
   a base having a recessed area and a cavity below the recessed area, the base further comprising an opening into the cavity;
   a base plate resting on the recessed area of the base and overlying the cavity, the base plate further comprising an edge having a notch and at least one hole extending from a bottom surface of the base plate to a top surface of the base plate;
   an electrical contact extending from the top surface of the base plate;
   a first seal along the notch of the base plate;
   a top ring that is supported by a second seal that is mounted between the top ring and the base;
   a third seal overlying the first seal and in contact with the top ring; and
   a cover ring that screws onto the base so that the cover ring applies pressure to the top ring and the second seal.

9. The holder of claim 8 wherein an ambient can be passed through the opening in the base, into the cavity, and through the at least one hole of the base plate.

10. The holder of claim 8 wherein the base, the base plate, and the cover ring are made from a polymer compound.

11. A method for processing a semiconductor substrate, the method comprising the steps of:
    providing a base having an electrical contact, a cavity, and an opening to the cavity;
    placing a first o-ring into the base;
    placing a semiconductor substrate into the base so that it contacts the first o-ring, the semiconductor substrate having a top surface and a bottom surface;
    placing a second o-ring overlying the top surface of the semiconductor substrate;
    placing a third o-ring onto the base;
    placing a top ring overlying the base such that it contacts the second o-ring and the third o-ring;
    placing a cover ring on the base such that the cover ring contacts the top ring so that pressure is applied to the second o-ring, which in turn applies pressure to the semiconductor substrate; and
    wherein the electrical contact is in contact with the semiconductor substrate.

12. The method of claim 11 further comprising the steps of:
    placing the base into a bath;
    adding an ambient gas through the opening in the base so that the cavity is pressurized; and
    checking for leaks along the top surface of the semiconductor substrate.

13. The method of claim 11 further comprising the steps of:
    placing the base into a chemical bath; and
    adding an ambient gas through the opening in the base so that the cavity is pressurized and so that pressure is applied to the bottom surface of the semiconductor substrate to compensate for pressure applied by the chemical bath.

14. The method of claim 13 wherein the ambient gas is nitrogen.

15. The method of claim 11 further comprising the step of placing a base plate into the base between the base and the first o-ring.

16. The method of claim 15 wherein the base plate provides support for the electrical contact.

17. The method of claim 11 wherein the step of placing the cover ring on the base includes the step of screwing the cover ring onto the base.

18. The method of claim 11 further comprising the step of placing a voltage potential onto the electrical contact to bias the bottom surface of the semiconductor substrate.

19. The method of claim 11 wherein the base is made from a polymer compound.

* * * * *